(12) United States Patent
Shimada et al.

(10) Patent No.: US 7,481,519 B2
(45) Date of Patent: Jan. 27, 2009

(54) ACTUATOR DEVICE AND LIQUID-JET HEAD

(75) Inventors: Masato Shimada, Nagano-ken (JP);
Takeshi Saito, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/756,995

(22) Filed: Jun. 1, 2007

(65) Prior Publication Data
US 2007/0284967 A1      Dec. 13, 2007

(30) Foreign Application Priority Data
Jun. 7, 2006      (JP) .............................. 2006-159027

(51) Int. Cl.
*B41J 2/295* (2006.01)
(52) U.S. Cl. .......................... 347/70; 310/324; 347/71; 347/69
(58) Field of Classification Search ................. 310/324; 347/70, 71
See application file for complete search history.

(56) References Cited

FOREIGN PATENT DOCUMENTS

| JP | 10-181013 A | 7/1998 |
|---|---|---|
| JP | 11-151815 A | 6/1999 |
| JP | 11-334063 | 12/1999 |
| JP | 2000-94688 A | 4/2000 |
| JP | 2001-146014 | 5/2001 |
| JP | 2001-179976 | 7/2001 |
| JP | 2002-120369 | 4/2002 |
| JP | 3295934 B2 | 4/2002 |
| JP | 2002-178514 | 6/2002 |
| JP | 3322310 B2 | 6/2002 |
| JP | 3491688 B2 | 11/2003 |
| JP | 3603931 B2 | 10/2004 |
| JP | 3636301 B2 | 1/2005 |

*Primary Examiner*—Thomas M. Dougherty
*Assistant Examiner*—Bryan P Gordon
(74) *Attorney, Agent, or Firm*—Sughrue Mion, PLLC

(57) ABSTRACT

An actuator device includes a plurality of piezoelectric elements formed on a surface of a substrate. Each piezoelectric element is configured of a piezoelectric layer, an upper electrode, and a lower electrode that is formed across the plurality of piezoelectric elements. The actuator device also includes a thin film portion provided to a region in the lower electrode between each adjacent two of the piezoelectric elements. The thin film portion has a thickness smaller than that of a region in the lower electrode provided to each piezoelectric element. The actuator device also includes a concave portion provided to the boundary portion between each thin film portion and the piezoelectric element adjacent thereto. In the actuator device, the inner surface and an edge of the opening, which is opposite to the adjacent piezoelectric element, of the concave portion are formed into curved surfaces.

6 Claims, 8 Drawing Sheets

ACTUATOR DEVICE AND LIQUID-JET HEAD

The entire disclosure of Japanese Patent Application No. 2006-159027 filed Jun. 7, 2006 is expressly incorporated by reference herein.

BACKGROUND

1. Technical Field

The present invention relates to an actuator device including piezoelectric elements displaceably provided on a substrate, and to a liquid-jet head using the actuator device.

2. Related Art

An actuator device including piezoelectric elements, each of which is displaced by application of a voltage, is used as, for example, a liquid-ejecting unit for a liquid-jet head mounted on a liquid-jet apparatus, which jets a liquid droplet. As such a liquid-jet head, for example, the following type of ink-jet recording head has been known. In the type of ink-jet recording head, a part of a pressure-generating chamber communicating with a nozzle orifice is formed of a vibration plate, which is deformed with the piezoelectric element. With the deformation, ink in the pressure-generating chamber is pressurized, and thus ink droplets are ejected from the nozzle orifice.

As an ink-jet recording head of this type, the following one has been proposed. Specifically, in the ink-jet recording head, a lower electrode is provided along a direction of the shorter sides of a plurality of piezoelectric elements. Then, lower electrode removed portions are provided by removing a region in the lower electrode between each adjacent two of the piezoelectric elements so as to have a thickness smaller than that of a region where each piezoelectric element is formed (for example, refer to p. 14 and FIG. 16 of JP-A-2005-94688).

In another ink-jet recording head that has also been proposed has a lower electrode removed portion provided on each side of the piezoelectric elements in the width direction of each piezoelectric element. In each lower electrode removed portion, a part of a lower electrode is partially removed so as to be formed into a thin film (for example, refer to p. 16 and FIG. 6 of JP-A-11-151815).

The configuration with lower electrode removed portions, such as ones disclosed in JP-A-2005-94688 and JP-A-11-151815, has the following advantage that the displacement characteristics of the vibration plate are improved, which results in an improvement in the displacement characteristics of each piezoelectric element. As a result, the ink-ejecting characteristics are improved. The above configuration, however, has a problem. Specifically, in the above configurations, stresses are concentrated on portions, such as a corner defined by the lower electrode removed portions. As a result, the drive durability is deteriorated.

Moreover, in a case where a protective film having moisture resistance is provided to the piezoelectric elements, another problem occurs. Specifically, when the protective film is formed, a surface unevenness or the like occurs in the protective film due to a corner defined by the lower electrode removed portion. As a result, the part of the protective film where the surface unevenness occurs is cracked by the drive of the piezoelectric elements.

SUMMARY

Accordingly, an advantage of some aspects of the invention is to provide an actuator device, in which the liquid-ejecting characteristics are improved while drive durability is maintained, and to provide a liquid-jet head using the actuator device.

A first aspect of the invention for solving the above described problems provides an actuator device with the following characteristics. The actuator device includes a plurality of piezoelectric elements formed on a surface of a substrate. Each piezoelectric element is configured of a lower electrode, a piezoelectric layer and an upper electrode. The lower electrode is formed across the plurality of piezoelectric elements. The actuator device also includes a thin film portion provided to a region in the lower electrode between each adjacent two of the piezoelectric elements. The thin film portion has a thickness smaller than that of a region in the lower electrode provided to each piezoelectric element. In addition, the actuator device includes a concave portion provided to the boundary portion between each thin film portion and each of adjacent two of the piezoelectric elements to the thin film portion. In the concave portion, the inner surface and an edge of the opening, which is opposite to the adjacent piezoelectric element, are formed into curved surfaces.

According to the first aspect, the thin film portion and the concave portion are provided to the lower electrode. This results in an improvement in the displacement characteristics of the piezoelectric elements. Meanwhile the rigidity of the lower electrode is maintained so that the drive durability of the lower electrode is also maintained. In addition, the curved inner surface and the curved edge of the opening of the concave portion contribute to an improvement in the rigidity of each concave portion, resulting in a more reliable achievement of improvement in drive durability.

A second aspect of the invention provides the actuator device according to the first aspect with the thin film portion and the concave portion provided along the longitudinal direction of each piezoelectric element.

According to the second aspect, it is possible to improve the displacement characteristics of the piezoelectric elements while the drive durability of the lower electrode is maintained.

A third aspect of the invention provides the actuator device according to the first or second aspect with a protective film formed of an insulating material. The protective film covers at least the concave portions and the side surfaces of each of the piezoelectric layers of the respective piezoelectric elements.

According to the third aspect, it is possible to prevent the piezoelectric elements from being damaged by moisture and the like in the air. In addition, the curved inner surface and the curved edge of the opening of the concave portion improve the adhesion of the protective film. This results in a securer prevention of damage to the piezoelectric elements.

A fourth aspect of the invention provides the actuator device according to the third aspect with the protective film provided across the plurality of piezoelectric elements.

According to the fourth aspect, it is possible to prevent the piezoelectric elements from being damaged by moisture and the like in the air.

A fifth aspect of the invention provides the actuator device according to any one of the first to fourth aspects with the following characteristics. The upper electrodes provided to the respective piezoelectric elements are independent of one another. In addition, the end portions of each upper electrode in the shorter-side direction of each piezoelectric element define the end portions, in the shorter-side direction, of a piezoelectric active portion, which is to be a substantial driving unit of the corresponding piezoelectric element. Moreover, the end portions of the lower electrode in the longitudinal direction of each piezoelectric element define the end portions, in the longitudinal direction, of the piezoelectric active portion.

According to the fifth aspect, the piezoelectric active portion has the end portions in the longitudinal direction defined by the lower electrode and the end portions in the shorter-side direction by the upper electrodes. Accordingly, it is possible to achieve high-density piezoelectric elements.

A sixth aspect of the invention provides a liquid-jet head that includes an actuator device according to any one of the first to fifth aspects as a liquid-ejecting unit configured to jet a liquid.

According to the sixth aspect, it is possible to improve the drive durability and, as a consequence, the reliability of the liquid-jet head. In addition, it is also possible to achieve a liquid-jet head with improved liquid-ejecting characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail.

Embodiment 1

Figure 1:
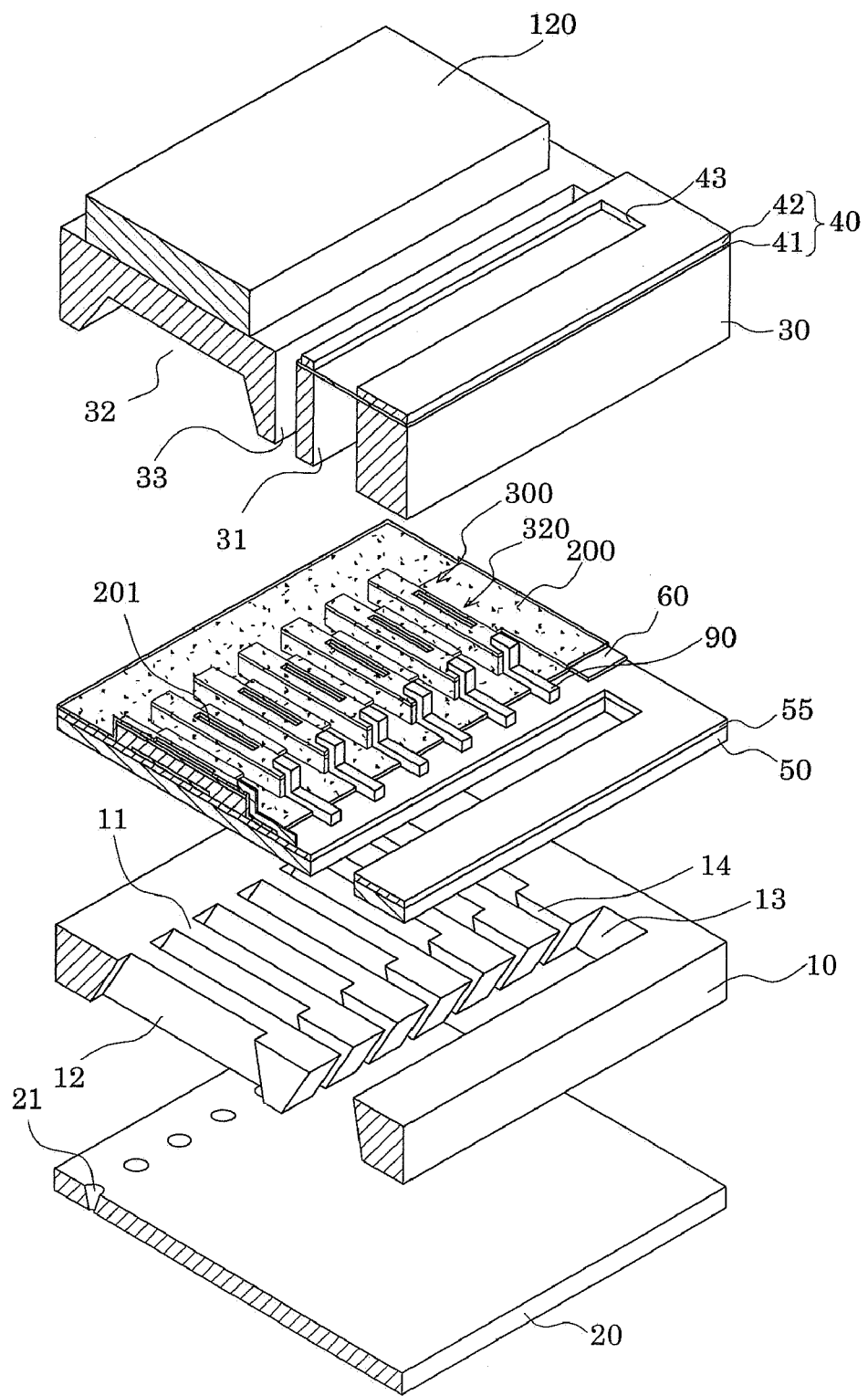
FIG. 1 is an exploded perspective view of a recording head according to Embodiment 1.
Figure 2A:
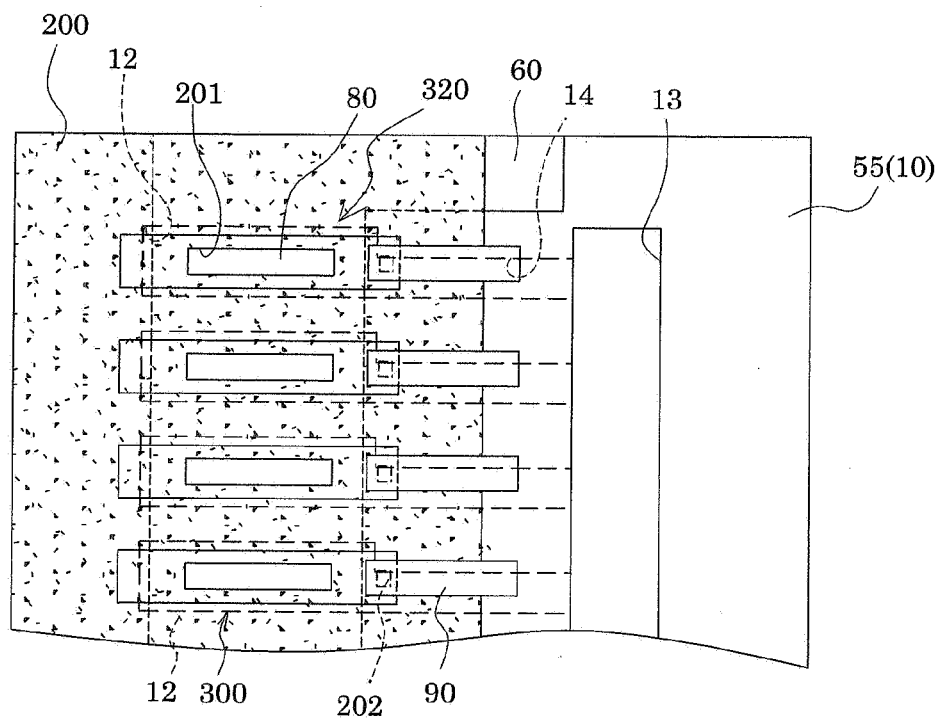
FIG. 2A is a plan view of the recording head according to Embodiment 1.
Figure 2B:
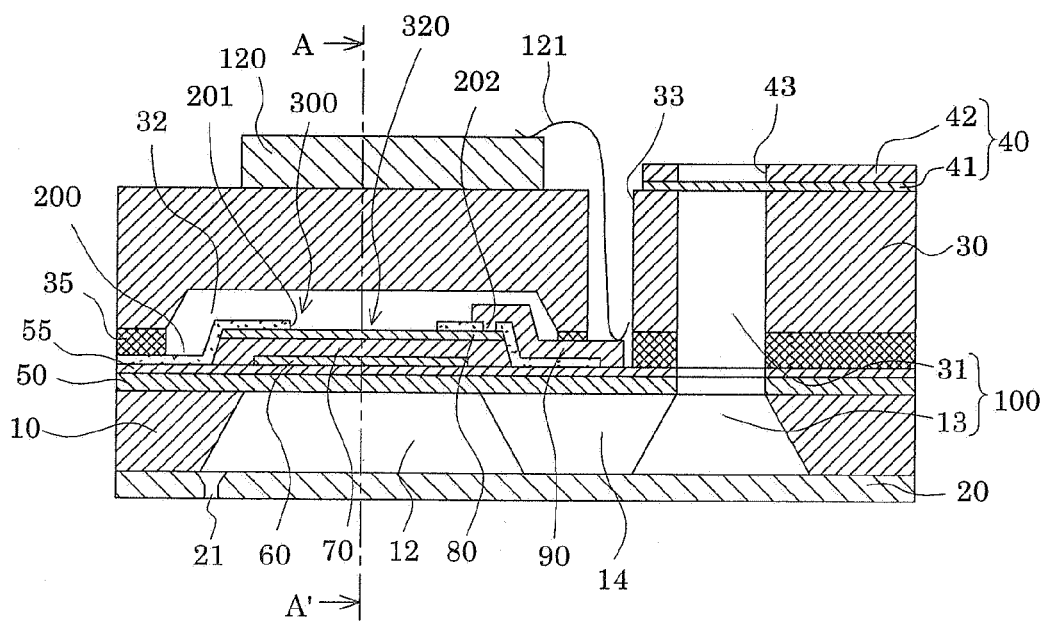
FIG. 2B is a cross-sectional view of the recording head according to Embodiment 1.
Figure 3A:
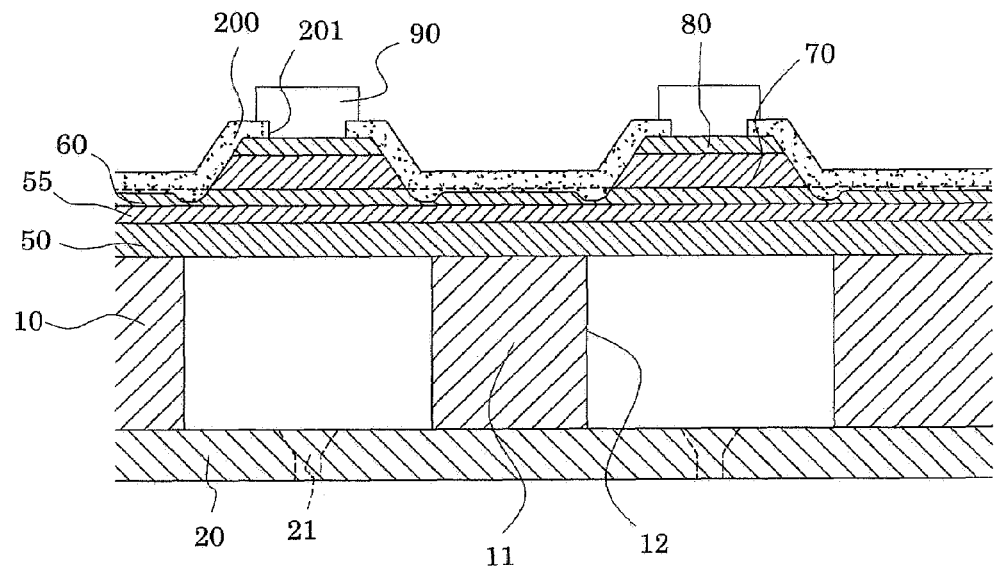
FIG. 3A is another cross-sectional view of the recording head according to Embodiment 1.
Figure 3B:
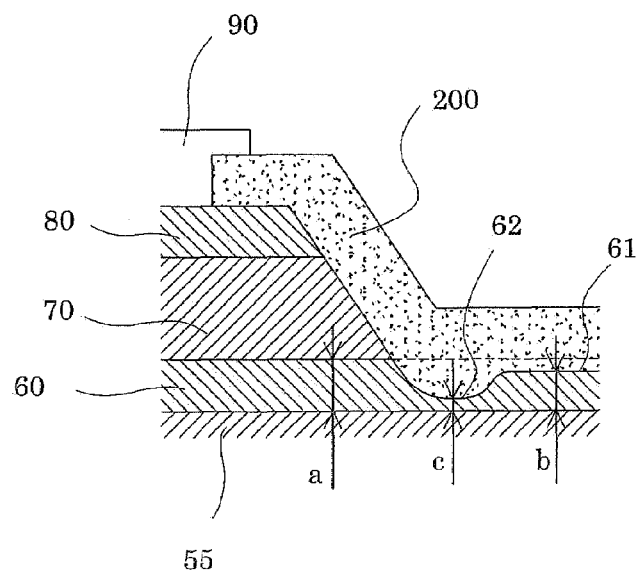
FIG. 3B is an enlarged cross-sectional view of a chief part in FIG. 3A.

FIG. 1 is an exploded perspective view of an ink-jet recording head that is an example of a liquid-jet head according to Embodiment 1 of the invention. FIG. 2A is a plan view of a passage-forming substrate, and FIG. 2B is a cross-sectional view in the longitudinal direction of a pressure-generating chamber. FIG. 3A is a cross-sectional view taken along the line A-A' in FIG. 2B, and FIG. 3B is an enlarged cross-sectional view of a chief part in FIG. 3A. In this embodiment, as shown in the drawings, a passage-forming substrate 10 is made of a single-crystal silicon substrate with (110) crystal plane orientation, and an elastic film 50 made of silicon dioxide is formed in advance on one surface of the passage-forming substrate 10 by means of thermal oxidation. Here, the elastic film 50 has a thickness of 0.5 µm to 2 µm.

In the passage-forming substrate 10, a plurality of pressure-generating chambers 12 are formed by anisotropically etching the passage-forming substrate 10 from the other surface of the passage-forming substrate 10. The pressure-generating chambers 12 are partitioned by a plurality of compartment walls 11, and are arranged in a row in the width direction (in the direction of the shorter side of each pressure-generating chamber 12, which is hereinafter referred to as the shorter-side direction). In addition, a communicating portion 13 is formed in a region in the passage-forming substrate 10 on the outer side in the longitudinal direction of the pressure-generating chambers 12. Ink supply paths 14 are provided respectively to the pressure-generating chambers 12, and the communicating portion 13 communicates with the pressure-generating chambers 12 respectively through the corresponding ink supply paths 14. The communicating portion 13 also communicates with a reservoir portion 31 of a protection plate 30, which is to be described later, so as to form a part of a reservoir 100, which serves as a common liquid chamber for the pressure-generating chambers 12. Each of the ink supply paths 14 is formed in a width smaller than the width of each of the pressure-generating chambers 12, so as to maintain, at a constant level, the passage resistance of ink flowing into each of the pressure-generating chambers 12 from the communicating portion 13. Incidentally, in the embodiment, each ink supply path 14 is formed by narrowing down the width of a corresponding passage from one side, but it may be formed by narrowing the width from both sides. Moreover, each ink supply path 14 may be formed by narrowing not the width but the thickness of the corresponding passage.

In addition, a nozzle plate 20, with nozzle orifices 21 drilled therein, is fixed to the opening surface side of the passage-forming substrate 10 with an adhesive agent, a thermal adhesive film or the like. The nozzle orifices 21 communicate respectively with vicinities of the opposite ends of the pressure-generating chambers 12 to the corresponding ink supply paths 14. It should be noted that the nozzle plate 20 is made of, for example, glass-ceramic materials, a single-crystal silicon substrate, stainless steel or the like.

On the other hand, the elastic film 50 having a thickness of, for example, about 1.0 µm is formed on the opposite surface of the passage-forming substrate 10 to the nozzle plate 20, as described above. On the elastic film 50, an insulation film 55 having a thickness of, for example, about 0.4 µm is formed.

Moreover, on the insulation film 55, a lower electrode film 60 having a thickness of, for example, about 0.2 µm, piezoelectric layers 70 each having a thickness of, for example, about 1.0 µm, and upper electrode films 80 each having a thickness of, for example, about 0.05 µm are laminated by means of a process to be described later. The lower electrode film 60, each of the piezoelectric layers 70 and a corresponding one of the upper electrode films 80 constitute one piezoelectric element 300. Here, each of the piezoelectric elements 300 indicates a portion including the lower electrode film 60, one of the piezoelectric layers 70 and a corresponding one of the upper electrode films 80. In general, each of the piezoelectric elements 300 is configured in the following manner. One of the electrodes of each piezoelectric element 300 is used as a common electrode. Then, the other one of the electrodes and the corresponding one of the piezoelectric layers 70 are patterned for each of the pressure-generating chambers 12. In a portion constituted of one of the electrodes and each piezoelectric layer 70, which are patterned, a piezoelectric strain occurs due to application of a voltage between the two electrodes. This portion is hereinafter called a piezoelectric active portion 320. In the embodiment, the lower electrode film 60 is used as a common electrode for the piezoelectric elements 300, and each of the upper electrode films 80 is used as an individual electrode for the corresponding one of the piezoelectric elements 300. However, it does not matter even if functions of the two electrode films are reversed due to the conditions of a drive circuit or wirings. In any case, the piezoelectric active portion 320 is formed for each pressure-generating chamber 12.

In addition, as shown in FIGS. 2A, 2B, 3A and 3B, in the embodiment, end portions of the lower electrode film 60 in the longitudinal direction of the pressure-generating chambers 12 (end portions of the lower electrode film 60 in the longitudinal direction of the piezoelectric elements 300) are provided within a region facing the pressure-generating chambers 12. Accordingly, end portions (the length) in the longitudinal direction of the piezoelectric active portions 320, which serve as actual drive units of the respective piezoelectric elements 300 are defined. Moreover, end portions of each upper electrode film 80 in the shorter-side direction of a corresponding one of the pressure-generating chambers 12 (end portions of each upper electrode film 80 in the shorter-side direction of a corresponding one of the piezoelectric elements 300) are provided within a region facing the corresponding one of the pressure-generating chambers 12. Accordingly, end portions (the width) of each piezoelectric active portion 320 in the shorter-side direction are defined. In other words, each piezoelectric active portion 320 is formed by the lower electrode film 60 and the corresponding one of the upper electrode films 80 thus patterned, so as to be only within a region facing the corresponding one of the pressure-generating chambers 12. Furthermore, in the embodiment, as shown in FIG. 3, each of the piezoelectric layers 70 and a corresponding one of the upper electrode film 80 are patterned in a manner that the width of the upper electrode film 80 side is smaller than that of the piezoelectric layer 70 side. Accordingly, each of the piezoelectric layers 70 and the corresponding one of the upper electrode film 80 have an inclined side surface.

In addition, a device, in which the piezoelectric elements 300 are provided on a predetermined plate and are driven, is here called an actuator device. In the embodiment, the lower electrode film 60 is provided along a direction in which the plurality of piezoelectric elements 300 are provided in a row. In addition, in the embodiment, end portions of the lower electrode film 60 in the longitudinal direction of each pressure-generating chamber 12 are provided so as to face the pressure-generating chambers 12. Moreover, in the above described example, the elastic film 50, the insulation film 55 and the lower electrode film 60 function together as a vibration plate. The invention is not limited to the case of this example. For example, the lower electrode film 60 may be configured to function by itself as a vibration plate without the elastic film 50 and the insulation film 55.

In addition, as shown in FIGS. 3A and 3B, a thin film portion 61 is provided to a region in the lower electrode film 60 between each adjacent two of the piezoelectric elements 300. Each thin film portion 61 has a thickness smaller than that of a region in the lower electrode film 60, which region is to be a part of the piezoelectric element 300. Moreover, a concave portion 62 is provided to the boundary portion in the lower electrode film 60 between each thin film portion 61 and the piezoelectric element 300 adjacent thereto. In the lower electrode film 60, a region in which the concave portion 62 is formed, is formed in a thickness smaller than the thickness of the thin film portion 61. Let's assume that the thickness of the lower electrode film 60 provided in a region where each piezoelectric element 300 is provided, is a; the thickness of a region where the thin film portion 61 is provided is b; and the thickness of a region where the concave portion 62 is provided is c. The relationship among the thicknesses satisfies an inequality: a>b>c. In the embodiment, the thickness a of the region that is to be a part of the piezoelectric element 300, of the lower electrode film 60 is set at 200 nm. In addition, the thickness b of the region, where the thin film portion 61 is provided, of the lower electrode film 60 is set at about 180 nm. Moreover, the thickness c of the region, where the concave portion 62 is provided, of the lower electrode film 60 is preferably set at 20 nm or more. This is because of the following reasons. Suppose that, in the lower electrode film 60, the thickness c of the region where the concave portion 62 is provided is smaller than 20 nm. In this case, the electrical conductivity between a part of the lower electrode film 60 provided to each piezoelectric element 300 and the thin film portion 61 of the lower electrode film 60 (a part of the lower electrode film 60 between the two piezoelectric elements 300 adjacent to each other) is decreased. In addition, the area of the lower electrode film 60 is decreased. Accordingly, when a large number of the piezoelectric elements 300 are driven at the same time, voltage drop occurs. As a result, stable ink-ejecting characteristics cannot be achieved. That is, by setting at 20 nm or more the thickness c of the region, where the concave portion 62 is provided, of the lower electrode film 60, the cross-sectional area of the lower electrode film 60 is increased, and accordingly, the resistance of the lower electrode film 60 is decreased. This makes it possible to prevent the occurrence of the voltage drop when a large number of the piezoelectric elements 300 are driven at the same time. As a result, stable ink-ejecting characteristics can be constantly obtained.

In addition, the concave portions 62 are provided in a manner that the inner surface of each concave portion 62 and the edge of the opening, which is opposite to the adjacent piezoelectric element 300, of each concave portion 62 are formed into curved surfaces. Specifically, the cross-sectional shapes of the concave portions 62, in the direction in which the piezoelectric elements 300 are provided in a row, of the inner surface of each concave portion 62 and of the edge of the opening, which is opposite to the adjacent piezoelectric element 300, of the concave portion 62 are formed into "R" shapes. It is preferable that the radius of curvature of the inner surface of the concave portion 62 be 50 nm or more, while it is preferable that the radius of curvature of the edge of the opening, which is opposite to the piezoelectric elements 300, of the concave portion 62 be 50 nm or more.

In this manner, in a region in the lower electrode film 60 between each adjacent two of the piezoelectric elements 300, the thin film portion 61 is provided, which has the thickness smaller than that of a region in the lower electrode film 60 being a part of the piezoelectric elements 300. In addition, the concave portion 62 is provided to the boundary portion in the lower electrode film 60 between each thin film portion 61 and the piezoelectric elements 300 adjacent thereto. This makes it possible to reduce the thickness c of the lower electrode film 60 on the two sides of each piezoelectric element 300 by providing the concave portions 62. Accordingly, the displacement characteristics of the vibration plate constituted of the lower electrode film 60 is improved, so that the displacement characteristics of the piezoelectric elements 300 are improved. As a result, the ink-ejecting characteristics are improved.

Moreover, in a region in the lower electrode film 60 between each adjacent two of the piezoelectric elements 300, the thin film portion 61 is provided, which has the thickness larger than the thickness c of the part of the lower electrode film 60 where the concave portion 62 is provided. Accordingly, it is possible to improve the ink-ejecting characteristics, while the reliability is improved by maintaining the rigidity of the vibration plate, and by thus maintaining the drive durability. That is, if the thickness of the region in the lower electrode film 60 between each adjacent two of the piezoelectric elements 300 were made equal to the thickness of the region in the lower electrode film 60 where the concave portion 62 is provided, the rigidity of the vibration plate should be deteriorated. As a result, when the piezoelectric elements 300 are repeatedly driven, the vibration plates are damaged.

Furthermore, in the embodiment, the inner surface of each concave portion 62 and the edge of the opening, which is opposite to the adjacent piezoelectric element 300, of each concave portion 62 are formed into curved surfaces, respectively. Accordingly, the rigidity of the region in the lower electrode film 60 where the concave portion 62 is provided is improved so that the lower electrode film 60 is prevented from being damaged. As a result, it is possible to improve the drive durability. In addition, by forming the inner surface of the concave portion 62 into a curved surface, it is possible to improve the rigidity of the vibration plate in the region where the concave portion 62 is provided. As a result, the drive durability can be more surely improved.

In addition, at least each concave portion 62 and the side surfaces of the piezoelectric layer 70 of each piezoelectric element 300 are covered with a protective film 200 made of a moisture-resistant insulation material. In the embodiment, the protective film 200 is provided to cover the side surfaces of the piezoelectric layers 70, the side surfaces of the upper electrode films 80 and the peripheral edges of the upper surfaces of the upper electrode films 80. Moreover, the protective film 200 is provided to continuously extend across the plurality of piezoelectric elements 300. In other words, the protective film 200 is not provided on a chief part of the upper surface of each upper electrode film 80, which part is substantially the center region in the upper surface of each upper electrode film 80. Accordingly, opening portions 201 are provided, respectively on the chief parts of the upper surfaces of the upper electrode films 80, to open the chief parts.

Each opening portion 201 penetrates the protective film 200 in the thickness direction so as to open the protective film 200 in a rectangular shape along the longitudinal direction of each piezoelectric element 300. For example, the opening portions 201 can be formed by selectively patterning the protective film 200 after the protective film 200 is formed over the entire surface of the passage-forming substrate 10.

By covering the piezoelectric elements 300 with the protective film 200 in the above described manner, it is possible to prevent damage to the piezoelectric elements 300 due to moisture and the like in the air. Here, for the protective film 200, any moisture-resistant material may be used. For example, it is preferable to use an inorganic insulating material, such as a silicon oxide ($SiO_x$), a tantalum oxide ($TaO_x$) or an aluminum oxide ($AlO_x$). It is especially preferable to use an aluminum oxide ($AlO_x$) that is an inorganic amorphous material, for example, alumina ($Al_2O_3$). When an aluminum oxide is used as a material for the protective film 200, it is possible to sufficiently prevent moisture transmission under a high humidity environment even in a case where the film thickness of the protective film 200 is made relatively small, for example, about 100 nm. In the embodiment, alumina ($Al_2O_3$) is used for the protective film 200.

In addition, by providing the opening portions 201 in the protective film 200, it is possible to maintain favorable ink-ejecting characteristics without inhibiting the displacements of the piezoelectric elements 300 (the piezoelectric active portions 320).

Moreover, in the embodiment, the inner surface of each concave portion 62 and the edge of the opening, which is opposite to the adjacent piezoelectric element 300, of the concave portion 62 are formed into curved surfaces. Accordingly, it is possible to improve the adhesion of the protective film 200 on the concave portions 62 and the thin film portions 61 so as to securely protect the piezoelectric elements 300. As a result, it is possible to surely prevent the piezoelectric elements 300 from being damaged. In other words, a corner existing in the inner surface of the concave portion 62, in the edge of the opening or the like, brings about a weak adhesion of the protective film 200, which results in a formation of the protective film 200 in a step-like shape. When the protective film 200 is formed in a step-like shape in this way, a drive of the piezoelectric element 300 produces a crack in the step. The crack, in turn, leads to damage to the piezoelectric element 300 by moisture.

On the protective film 200, lead electrodes 90 made of, for example, gold (Au), are provided. One end portion of each lead electrode 90 is connected to the corresponding upper electrode film 80 via a corresponding one of communicating holes 202 provided in the protective film 200. In addition, the other end portion of each lead electrode 90 extends to the side of the ink supply paths 14 in the passage-forming substrate 10. The extended other end portions of the lead electrodes 90 are connected to a drive circuit 120, to be described later, for driving the piezoelectric elements 300 respectively via connecting wirings 121.

Moreover, a protection plate 30 is joined with an adhesive agent 35 to the top of the passage-forming substrate 10 where the piezoelectric elements 300 are formed. The reservoir portion 31 is formed in a region facing the communicating portion 13, in the protection plate 30. The reservoir portion 31 communicates, as described above, with the communicating portion 13 in the passage-forming substrate 10 so as to form a part of the reservoir 100, which serves as the common liquid chamber for the pressure-generating chambers 12.

In addition, a piezoelectric element holding portion 32 is provided in a region facing the piezoelectric elements 300, in the protection plate 30. The piezoelectric element holding portion 32 is configured to have enough space in a region facing the piezoelectric element 300 to allow an uninhibited movement of the piezoelectric elements 300. It should be noted that, as long as the piezoelectric element holding portion 32 has enough space so that the movement of the piezoelectric elements 300 is not inhibited, it does not matter whether or not the space is sealed with the piezoelectric element holding portion 32.

Moreover, a penetrated hole 33 is provided in a region between the piezoelectric element holding portion 32 and the reservoir portion 31, in the protection plate 30. The penetrated hole 33 penetrates the protection plate 30 in the thickness direction. A part of the lower electrode film 60 and the leading end portion of each lead electrode 90 are exposed in the penetrated hole 33.

In addition, the drive circuit 120 for driving the piezoelectric elements 300 is mounted on the protection plate 30. As the drive circuit 120, it is possible to use, for example, a circuit board, a semiconductor integrated circuit (IC) or the like. The drive circuit 120 and each lead electrode 90 are electrically connected to each other via the connecting wiring 121 formed of a conductive wire, such as a bonding wire.

For the protection plate 30, it is preferable to use a material having substantially the same thermal expansion coefficient as that of the passage-forming substrate 10, for example, glass, a ceramic material or the like. In the embodiment, the protection plate 30 is made of a single-crystal silicon substrate with (110) crystal plane orientation, which is the same material as that of the passage-forming substrate 10.

In addition, a compliance plate 40 is joined to the top of the protection plate 30. The compliance plate 40 is constituted of a sealing film 41 and a fixing plate 42. Here, the sealing film 41 is made of a flexible material with low rigidity (for example, polyphenylene sulfide (PPS) film having a thickness of 6 μm). One side of the reservoir portion 31 is sealed with the sealing film 41. On the other hand, the fixing plate 42 is made of a hard material, such as metal (for example, stainless steel (SUS) or the like having a thickness of 30 μm). An opening portion 43 is formed in a region facing the reservoir 100 in the fixing plate 42. In the opening portion 43, part of the fixing plate 42 is completely removed in the thickness direction. For this reason, one side of the reservoir 100 is sealed with only the flexible sealing film 41.

In the ink-jet recording head of the embodiment as described above, ink is, firstly, taken in from unillustrated external ink supply means, so that the inside of the ink-jet recording head, from the reservoir 100 to the nozzle orifices 21, is filled with the ink thus taken in. Then, voltage is applied between the lower electrode film 60 and the upper electrode films 80, which correspond to the respective pressure-generating chambers 12 in accordance with recording signals transmitted from the drive circuit 120. Accordingly, the elastic film 50, the insulation film 55, the lower electrode film 60 and the piezoelectric layers 70 are flexurally deformed so that the pressure in each pressure-generating chamber 12 is increased. As a result, ink droplets are ejected from the nozzle orifices 21.

Hereinafter, descriptions will be given of a method of fabricating such an ink-jet recording head as described above, with reference to FIGS. 4A to 8. FIGS. 4A to 8 are cross-sectional views, which are taken along a direction in which the pressure-generating chambers are arranged in a row, and which shows the method of fabricating an ink-jet recording head.

Figure 4A:
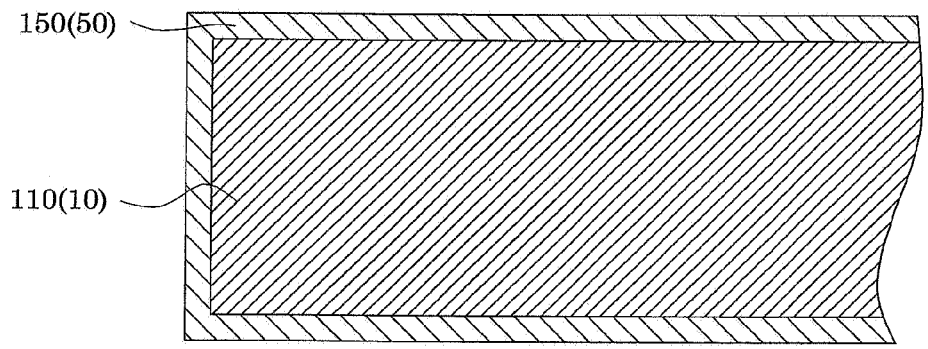
FIG. 4A is a first cross-sectional view showing a method of manufacturing the recording head according to Embodiment 1.

Firstly, as shown in FIG. 4A, a wafer 110 for a passage-forming substrate, which is a silicon wafer formed of a single-crystal silicon substrate, is thermally oxidized in a diffusion furnace at a temperature of about 1100° C. Accordingly, a silicon dioxide film 150, which is to constitute an elastic film 50, is formed on the surface of the wafer 110 for a passage-forming substrate. It should be noted that, in the embodiment, a silicon wafer with (110) priority orientation, which has a relatively large thickness of about 625 μm, and as a result, a high rigidity, is used for the wafer 110 for a passage-forming substrate.

Figure 4B:
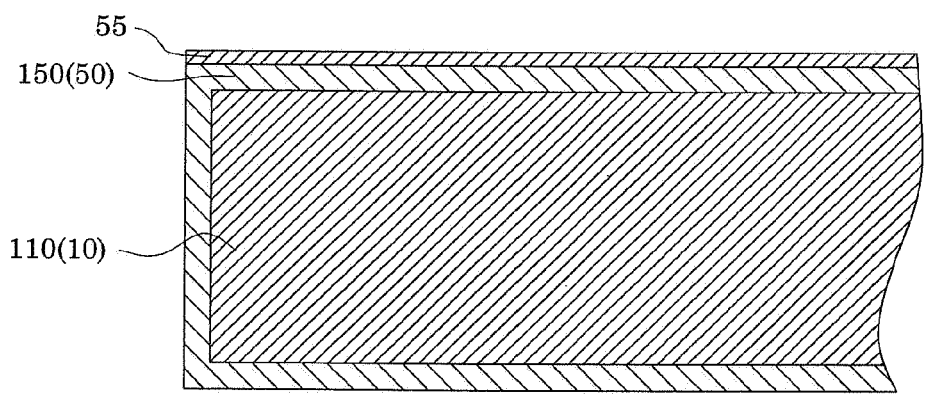
FIG. 4B is a second cross-sectional view showing the method of manufacturing the recording head according to Embodiment 1.

Next, as shown in FIG. 4B, an insulation film 55 made of zirconium dioxide ($ZrO_2$) is formed on the elastic film 50 (the silicon dioxide film 150). Specifically, a zirconium (Zr) layer is firstly formed on the elastic film 50 by means of a sputtering method or the like. Then, the zirconium layer thus formed is thermally oxidized in a diffusion furnace at the temperature of, for example, 500° C. to 1200° C., so that the insulation film 55 made of zirconium dioxide is formed.

Figure 4C:
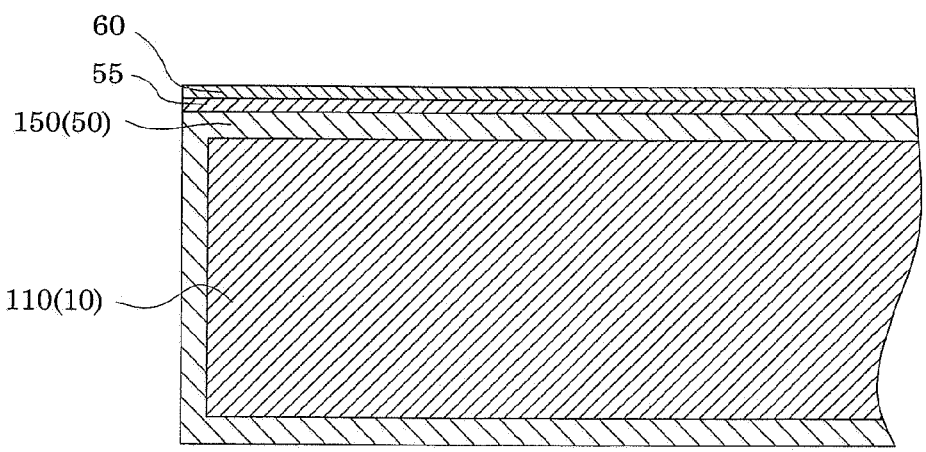
FIG. 4C is a third cross-sectional view showing the method of manufacturing the recording head according to Embodiment 1.

Then, as shown in FIG. 4C, a lower electrode film 60 is formed by laminating, for example, platinum (Pt) and iridium (Ir) on the insulation film 55. Thereafter, the lower electrode film 60 thus formed is patterned into a predetermined shape. Incidentally, the material for the lower electrode film 60 is not limited to that formed by laminating platinum (Pt) and iridium (Ir), and a material obtained by alloying platinum (Pt) with iridium (Ir) may also be used. Any one of platinum and iridium may also be used to form a single layer to function as the lower electrode film 60. Alternatively, it is also possible to use a metal, a metal oxide or the like other than these above-mentioned materials.

Figure 5A:
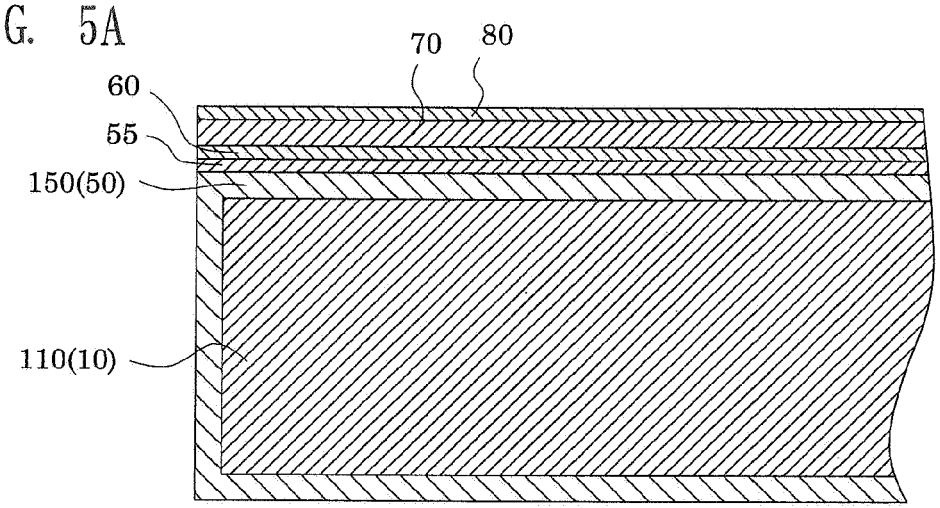
FIG. 5A is a fourth cross-sectional view showing the method of manufacturing the recording head according to Embodiment 1.

Subsequently, as shown in FIG. 5A, a piezoelectric layer 70 made of lead-zirconate-titanate (PZT), for example, and an upper electrode film 80 made of iridium, for example, are sequentially formed over the entire surface of the wafer 110 for a passage-forming substrate.

Figure 5B:
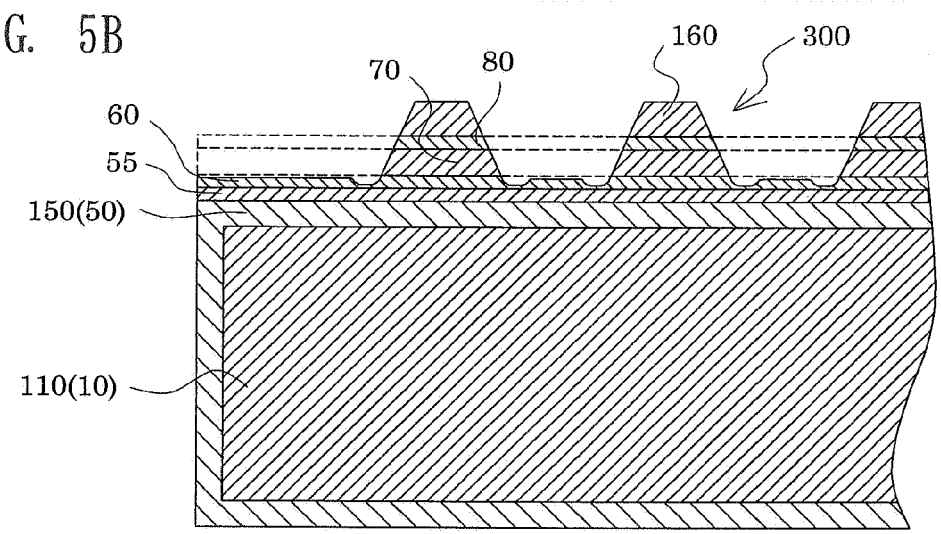
FIG. 5B is a fifth cross-sectional view showing the method of manufacturing the recording head according to Embodiment 1.

Thereafter, as shown in FIG. 5B, the piezoelectric layer 70 and the upper electrode film 80 thus formed are patterned into a shape corresponding to regions facing respective pressure-generating chambers 12, so that piezoelectric elements 300 are formed. The piezoelectric layer 70 and the upper electrode film 80 can be patterned at once in the following manner. Specifically, a resist 160 is formed into a predetermined shape on the upper electrode film 80 by means of a photolithography method. Then, the piezoelectric layer 70 and the upper electrode film 80 are patterned by dry etching with the resist 160.

In addition, when the piezoelectric layer 70 and the upper electrode film 80 are patterned by dry etching, the dry etching is continuously performed until the etched portions reach the lower electrode film 60. By performing this dry etching, the thin film portions 61 and the concave portions 62 area also provided in the lower electrode film 60. Specifically, each thin film portion 61 having a thickness smaller than that of each piezoelectric element 300 is formed in the lower electrode film 60 between each adjacent two of the piezoelectric elements 300, while each concave portion 62 is formed in the boundary portion between each thin film portion 61 and the piezoelectric element 300 adjacent thereto. Moreover, at this time, the concave portions 62 are formed in a manner that the inner surface of each concave portion 62 and an edge of the opening, which is opposite to the adjacent piezoelectric element 300, of the concave portion 62 are formed into curved surfaces.

The thin film portions 61 and the concave portions 62 as described above can be consciously formed by appropriately changing the voltage, the temperature and the like at the time of performing the dry etching. In addition, by performing the dry etching on regions each in the lower electrode film 60 between each two adjacent piezoelectric elements 300, it is possible to make the surface roughness of the lower electrode film 60 uniform. Accordingly, when the protective film 200 is formed on the lower electrode film 60 in a process to be described later, it is possible to improve the adhesion of the protective film 200.

In the embodiment, the thin film portions 61 and the concave portions 62 are formed at one time when the dry etching is performed on the piezoelectric layer 70 and the upper electrode film 80. However, the method of forming the thin film portions 61 and the concave portions 62 is not limited to this. For example, the thin film portions 61 and the concave portions 62 may be formed in the following manner. Specifically, when the resist 160 is formed, part of the resist 160 is thinly left in regions other than those in which the concave portions 62 are formed. Accordingly, when the piezoelectric layer 70 and the upper electrode film 80 are patterned by dry etching with the resist 160, the thin film portions 61 and the concave portions 62 are easily formed.

In addition, as a material for the piezoelectric layer 70 constituting the piezoelectric elements 300, it is possible to use, for example, a ferroelectric-piezoelectric material, such as lead-zirconate-titanate (PZT); or a relaxor ferroelectric, which is obtained by adding a metal, such as niobium, nickel, magnesium, bismuth or yttrium, to the ferroelectric-piezoelectric material. The composition of the relaxor ferroelectric may be determined in consideration of the characteristics, the usage and the like, of the piezoelectric elements 300. Moreover, the method of forming the piezoelectric layer 70 is not limited to any specific method. For example, in the embodiment, a so-called sol-gel method is used for forming the piezoelectric layer 70. Specifically, in the sol-gel method, sol is obtained by dissolving and dispersing a metal organic substance in a catalytic agent. The sol is coated and dried so as to be turned into gel. Moreover, the gel is baked at a high temperature. Consequently, the piezoelectric layer 70 made of a metal oxide is obtained. The method of forming the piezoelectric layer 70 is not limited to the sol-gel method. Alternatively the piezoelectric layer 70 may be formed, for example, by using a method of forming thin films, such as a metal organic decomposition (MOD) method and a sputtering method.

In practice, the piezoelectric layer 70 is formed in the following manner. A process of forming a piezoelectric film having a small thickness is repeated a plurality of times by means of the above described sol-gel method. In this way, the piezoelectric layer 70 constituted of a plurality of piezoelectric films thus layered is formed. Moreover, the lower electrode film 60 is formed in the following manner. For example, after the lower electrode film 60 is formed above the wafer 110 for a passage-forming substrate, a piezoelectric film of the first layer is deposited on the lower electrode film 60. Then, the lower electrode film 60 and the piezoelectric film of the first layer are patterned at the same time. This makes it possible to constitute a bedding to be used at the time of baking and crystallizing the piezoelectric film provided above the entire surface of the wafer 110 for a passage-forming substrate. As a result, the crystallinity of the piezoelectric film is improved.

Figure 5C:
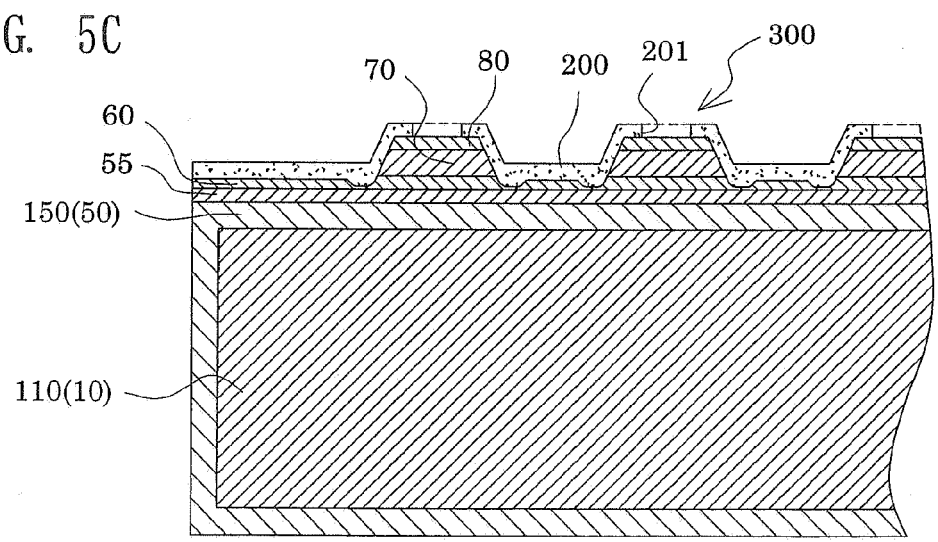
FIG. 5C is a sixth cross-sectional view showing the method of manufacturing the recording head according to Embodiment 1.

Next, as shown in FIG. 5C, after the resist 160 is removed, the protective film 200 is formed above the entire surface of the wafer 110 for a passage-forming substrate. Thereafter, the protective film 200 is patterned into a predetermined shape, so that opening portions 201 and communicating holes 202 are formed.

Figure 6A:
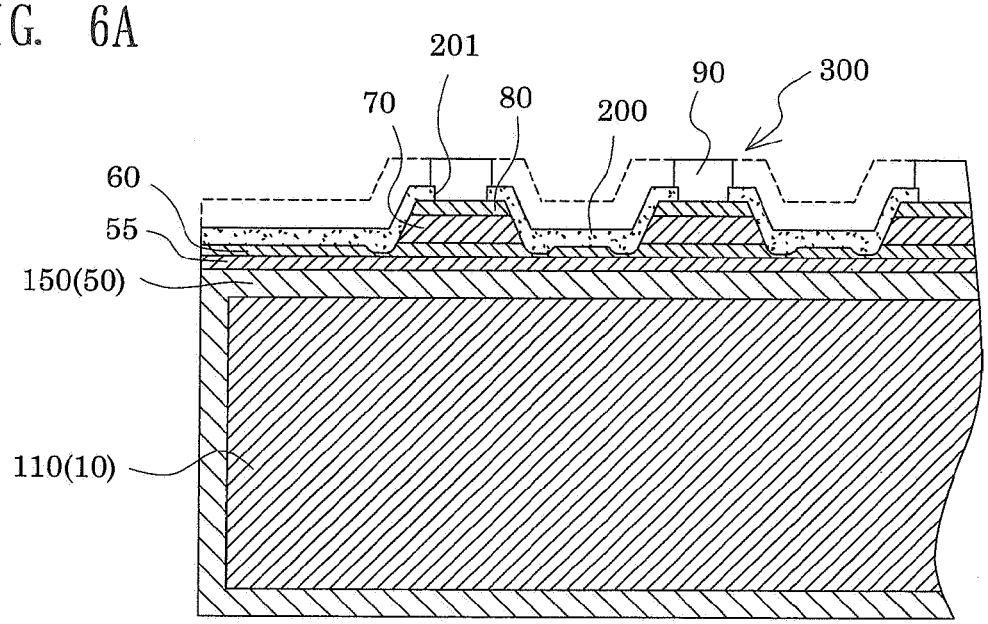
FIG. 6A is a seventh cross-sectional view showing the method of manufacturing the recording head according to Embodiment 1.

Subsequently, as shown in FIG. 6A, lead electrodes 90 made of gold (Au) are formed above the entire surface of the wafer 110 for a passage-forming substrate. Then the lead electrodes 90 are patterned for the respective piezoelectric elements 300.

Figure 6B:
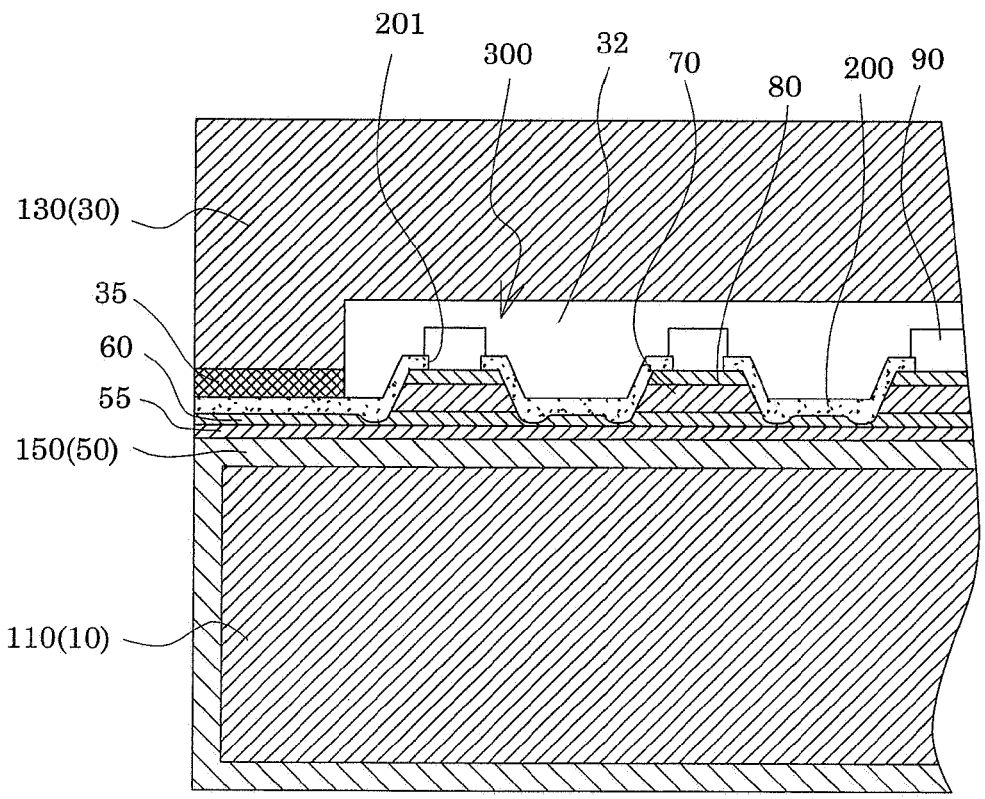
FIG. 6B is an eight cross-sectional view showing the method of manufacturing the recording head according to Embodiment 1.

Thereafter, as shown in FIG. 6B, a wafer 130 for a protection plate is joined to the top of the wafer 110 for a passage-forming substrate with the adhesive agent 35. Here, the reservoir portion 31 and the piezoelectric element holding portion 32 have been formed in advance in the wafer 130 for a protection plate. The wafer 130 for a protection plate is configured to have a thickness of, for example, about 400 μm. For this reason, by joining the wafer 130 for a protection plate to the top of the wafer 110 for a passage-forming substrate, it is possible to significantly improve the rigidity of the wafer 110 for a passage-forming substrate.

Figure 7A:
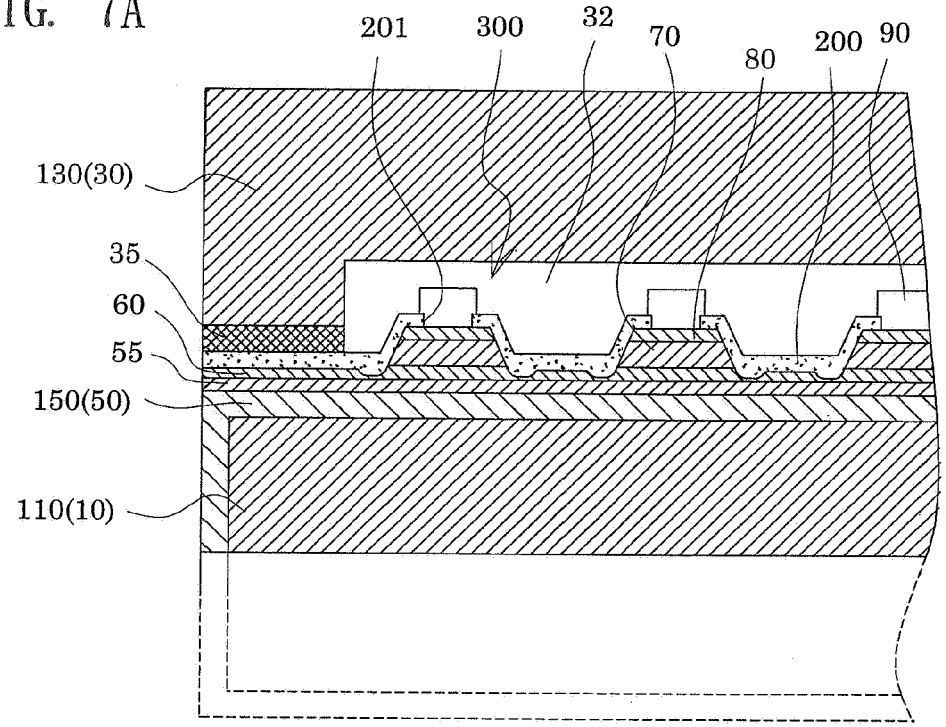
FIG. 7A is a ninth cross-sectional view showing the method of manufacturing the recording head according to Embodiment 1.

Next, as shown in FIG. 7A, the wafer 110 for a passage-forming substrate is polished so as to have a certain thickness. Moreover, wet etching is performed further on the wafer 110 for a passage-forming substrate by using a mixture of hydrofluoric-nitric acid as an etchant, so that the wafer 110 for a passage-forming substrate has a predetermined thickness. For example, in the embodiment, by performing the polishing and the wet etching, the wafer 110 for a passage-forming substrate is processed so as to have a thickness of approximately 70 μm.

Figure 7B:
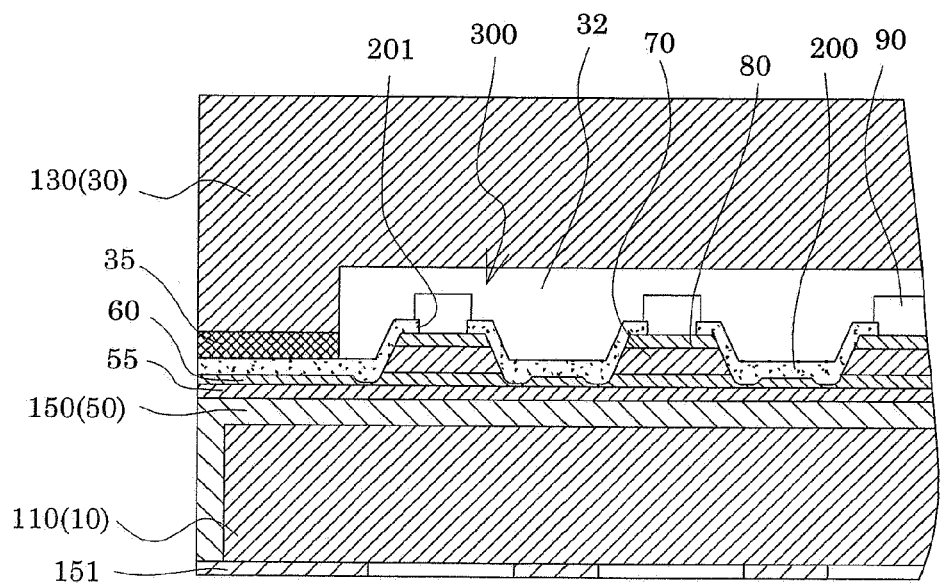
FIG. 7B is a tenth cross-sectional view showing the method of manufacturing the recording head according to Embodiment 1.
Figure 8:
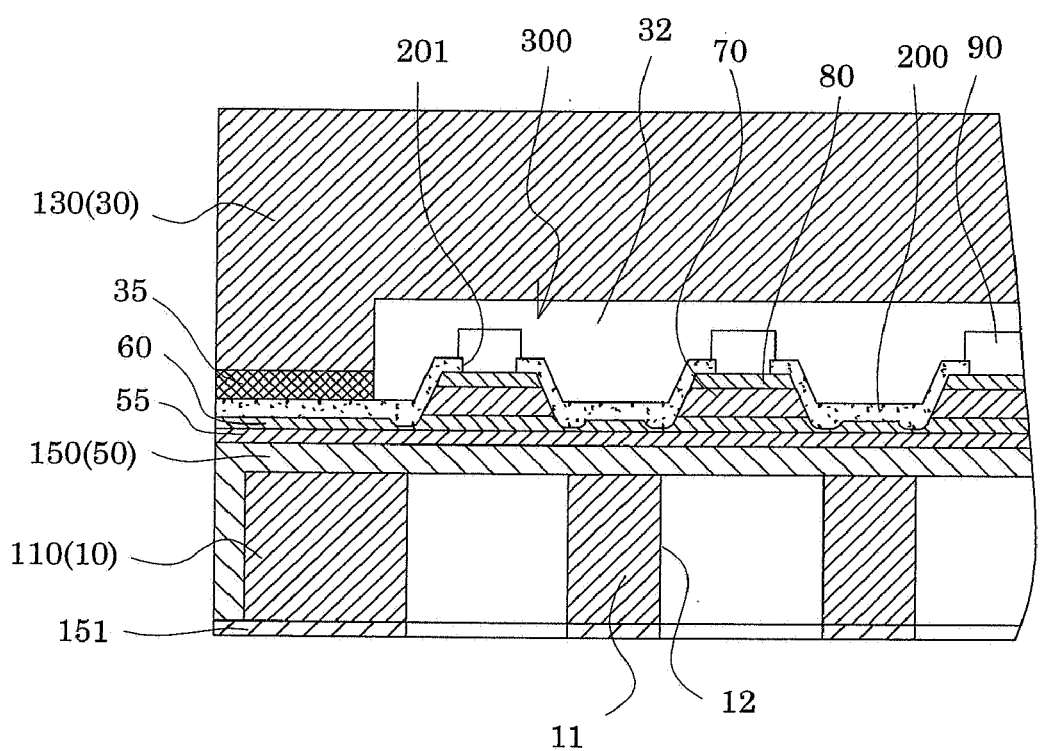
FIG. 8 is an eleventh cross-sectional view showing the method of manufacturing the recording head according to Embodiment 1.

Subsequently, as shown in FIG. 7B, a mask film 151 made of silicon nitride (SiN) is newly formed on the wafer 110 for a passage-forming substrate, and is then patterned into a predetermined shape. Thereafter, anisotropic etching (wet etching) using an alkaline solution, such as KOH, is performed on the wafer 110 for a passage-forming substrate with the mask film 151 thus patterned. As a result, the pressure-generating chambers 12, the communicating portions 13 and the ink supply paths 14 are formed in the wafer 110 for a passage-forming substrate.

Subsequently, the mask film 151 on the surface of the wafer 110 for a passage-forming substrate, in which surface each pressure-generating chamber 12 is opened, is removed. Then, unnecessary part of the outer peripheral portions of the wafer 110 for a passage-forming substrate and the wafer 130 for a protection plate is cut off so as to be removed by, for example, dicing or the like. Subsequently, the nozzle plate 20, in which the nozzle orifices 21 are drilled, is joined to the opposite surface of the wafer 110 for a passage-forming substrate to the wafer 130 for a protection plate. At the same time, a compliance plate 40 is joined to the surface of the wafer 130 for a protection plate. Thereafter, the wafer 110 for a passage-forming substrate and the like are divided into pieces of passage-forming substrates 10 and the like, each piece having one chip size as shown in FIG. 1. As a result, an ink-jet recording head having the above-described configuration is fabricated.

Other Embodiments

Although Embodiment 1 of the invention has been described above, the basic configuration of the invention is not limited to that described above. For example, in Embodiment 1 described above, the protection film 200 is provided continuously on the plurality of piezoelectric elements 300 (piezoelectric active portion 320). However, the configuration is not limited to this. For example, the protective film 200 may be provided individually for each piezoelectric element 300.

Moreover, Embodiment 1 has been described by giving an ink-jet recording head as an example of liquid-jet heads. However, the invention is intended to be widely applied to the entire range of liquid-jet heads. The invention can be applied to any liquid-jet head which ejects a liquid other than ink. Examples of liquid-jet head which ejects a liquid other than ink include: various recording heads used for image recording apparatuses such as printers; heads that eject liquids containing color materials used for manufacturing color filters of liquid crystal display devices and the like; electrode-material-jet heads used for forming electrodes of organic EL display devices, FED (Field Emission Display) devices and the like; bio-organic-substance-jet heads used for manufacturing biochips; and the like. It should be noted that the invention can be applied to not only actuator devices to be mounted on liquid-jet heads (ink-jet recording head and the like), but also actuator devices to be mounted on any kinds of apparatuses.

What is claimed is:

1. An actuator device comprising:
   a plurality of piezoelectric elements formed on a surface of a substrate, each piezoelectric element being configured of a piezoelectric layer, an upper electrode, and a lower electrode that is formed across the plurality of piezoelectric elements;
   a thin film portion provided to a region in the lower electrode between each adjacent two of the piezoelectric elements, the thin film portion having a thickness smaller than that of a region in the lower electrode provided to each piezoelectric element; and
   a concave portion provided to the boundary portion between each thin film portion and the piezoelectric element adjacent thereto,
   wherein the inner surface and an edge of the opening, which is opposite to the adjacent piezoelectric element, of the concave portion are formed into curved surfaces.

2. The actuator device according to claim 1 wherein the thin film portion and the concave portion are provided along the longitudinal direction of each piezoelectric element.

3. The actuator device according to claim 1 further comprising a protective film formed of an insulating material, the protective film covering at least the concave portions and the side surfaces of each piezoelectric layer of each piezoelectric element.

4. The actuator device according to claim 3 wherein the protective film is provided across the plurality of piezoelectric elements.

5. The actuator device according to claim 1 wherein
   the upper electrodes provided to the respective piezoelectric elements are independent of one another,
   the end portions of each upper electrode in the shorter-side direction of each piezoelectric element define the end portions, in the shorter-side direction, of a piezoelectric active portion, which is to be a substantial driving unit of the corresponding piezoelectric element, and
   the end portions of the lower electrode in the longitudinal direction of each piezoelectric element define the end portions of the piezoelectric active portion in the longitudinal direction.

6. A liquid-jet head comprising an actuator device according to claim 1 as a liquid-ejecting unit configured to jet a liquid.

* * * * *